United States Patent
McLellan

(10) Patent No.: US 10,374,380 B1
(45) Date of Patent: Aug. 6, 2019

(54) LASER DIODE PUMPED WHITE LIGHT EMITTER MODULE

(71) Applicant: Brant C. McLellan, Phoenix, AZ (US)

(72) Inventor: Brant C. McLellan, Phoenix, AZ (US)

(*) Notice: Subject to any disclaimer, the term of this patent is extended or adjusted under 35 U.S.C. 154(b) by 0 days.

(21) Appl. No.: 15/976,188

(22) Filed: May 10, 2018

(51) Int. Cl.
| | |
|---|---|
| *H01S 3/09* | (2006.01) |
| *H01S 3/0941* | (2006.01) |
| *H01S 3/00* | (2006.01) |
| *H01S 3/08* | (2006.01) |
| *H01S 3/07* | (2006.01) |
| *H01S 3/06* | (2006.01) |

(52) U.S. Cl.
CPC .......... *H01S 3/09415* (2013.01); *H01S 3/005* (2013.01); *H01S 3/0612* (2013.01); *H01S 3/07* (2013.01); *H01S 3/08054* (2013.01)

(58) Field of Classification Search
CPC .... H01S 3/09415; H01S 3/005; H01S 3/0612; H01S 3/07; H01S 3/08054; H01S 3/08059; H01S 3/094; H01S 3/0941; H01S 3/041; H01S 3/10; H01S 3/4025
See application file for complete search history.

(56) References Cited

U.S. PATENT DOCUMENTS

| | | | |
|---|---|---|---|
| 5,177,764 A * | 1/1993 | Nilsson ................. | H01S 3/0606 372/105 |
| 6,841,804 B1 | 1/2005 | Chen et al. | |
| 7,230,280 B2 | 6/2007 | Yaw et al. | |
| 7,736,044 B2 | 6/2010 | Chew et al. | |
| 8,360,603 B2 | 1/2013 | Rains | |
| 9,103,517 B2 | 8/2015 | Nakazato et al. | |
| 9,611,987 B2 | 4/2017 | Kelchner et al. | |
| 2002/0018288 A1* | 2/2002 | Rieger .................. | H01S 3/0606 359/342 |
| 2008/0247438 A1* | 10/2008 | Du .......................... | H01S 3/061 372/75 |
| 2015/0357790 A1* | 12/2015 | Jeoung ..................... | F21V 5/04 372/32 |

* cited by examiner

*Primary Examiner* — Armando Rodriguez
(74) *Attorney, Agent, or Firm* — Perry S. Clegg; Kunzler Bean & Adamson, PC

(57) ABSTRACT

An apparatus includes a thermally conductive housing including a reflective chamber, the reflective chamber including a reflective surface on a first side of the reflective chamber and an orifice on a second side of the reflective chamber. The reflective surface includes a converging surface annularly surrounding a central recirculating surface. The apparatus includes a phosphor converter at the orifice of the reflective chamber. The apparatus further includes a plurality of laser diodes arranged annularly around the orifice, the plurality of laser diodes configured to emit laser beams towards the converging surface.

19 Claims, 12 Drawing Sheets

LASER DIODE PUMPED WHITE LIGHT EMITTER MODULE

CROSS REFERENCE TO RELATED APPLICATIONS

No Applicable.

FIELD

This application relates generally to emitter modules. In particular, this application relates to laser diode pumped emitter modules.

BACKGROUND

As demands for beam control become more stringent, the need for higher illuminance is required. High-Intensity Discharge, or (HID), brought great improvement to the incandescent lamp by replacing the traditional filament with a superheated globe of plasma. Such increases in luminous density allowed for luminaries to be smaller and more efficient. However, the nature of the HID lamp results in high-voltage requirements, complex electronic circuitry, and low life expectancy. While Light-Emitting Diodes, or LEDs, provide improvements in many areas of performance, they fail to match the lumen density of HID.

SUMMARY

The subject matter of the present application has been developed in response to the present state of the art, and in particular, in response to the problems and disadvantages associated with conventional lighting apparatuses that have not yet been fully solved by currently available techniques. Accordingly, the subject matter of the present application has been developed to provide embodiments of a system, an apparatus, and a method that overcome at least some of the shortcomings of prior art techniques.

Disclosed herein is an apparatus according to one or more examples of the present disclosure. The apparatus includes apparatus includes a thermally conductive housing including a reflective chamber, the reflective chamber including a reflective surface on a first side of the reflective chamber and an orifice on a second side of the reflective chamber. The reflective surface includes a converging surface annularly surrounding a central recirculating surface. The apparatus includes a phosphor converter at the orifice of the reflective chamber. The apparatus further includes a plurality of laser diodes arranged annularly around the orifice, the plurality of laser diodes configured to emit laser beams towards the converging surface. The preceding subject matter of this paragraph characterizes example 1 of the present disclosure.

The converging surface is a parabolic surface configured to converge the laser beams at the phosphor converter. The preceding subject matter of this paragraph characterizes example 2 of the present disclosure, wherein example 2 also includes the subject matter according to example 1, above.

The recirculating surface is a spherical surface configured to reflect back recirculating light from the phosphor converter. The preceding subject matter of this paragraph characterizes example 3 of the present disclosure, wherein example 3 also includes the subject matter according to any one of examples 1-2, above.

The reflective chamber is formed by a heat sink and a reflector coupled to the heat sink, wherein the reflector comprises the reflective surface and the heat sink comprises the orifice. The preceding subject matter of this paragraph characterizes example 4 of the present disclosure, wherein example 4 also includes the subject matter according to any one of examples 1-3, above.

The heat sink comprising a conical cavity below the orifice. The preceding subject matter of this paragraph characterizes example 5 of the present disclosure, wherein example 5 also includes the subject matter according to any one of examples 1-4, above.

The heat sink comprising a plurality of apertures arranged annularly around the central orifice to receive the plurality of laser diodes. The preceding subject matter of this paragraph characterizes example 6 of the present disclosure, wherein example 6 also includes the subject matter according to any one of examples 1-5, above.

The heat sink comprising a protruding rim on a first side of the heat sink, the protruding rim annularly surrounding the plurality of apertures. The preceding subject matter of this paragraph characterizes example 7 of the present disclosure, wherein example 7 also includes the subject matter according to any one of examples 1-6, above.

The heat sink includes a plurality of projections extending out a second side of the heat sink. The preceding subject matter of this paragraph characterizes example 8 of the present disclosure, wherein example 8 also includes the subject matter according to any one of examples 1-7, above.

The heat sink includes a conical cavity below the orifice, a plurality of apertures arranged annularly around the central orifice to receive the plurality of laser diodes, a protruding rim on a first side of the heat sink, the protruding rim annularly surrounding the plurality of apertures, and a plurality of projections extending out a second side of the heat sink. The preceding subject matter of this paragraph characterizes example 9 of the present disclosure, wherein example 9 also includes the subject matter according to any one of examples 1-8, above.

The apparatus includes an odd number of laser diodes. The preceding subject matter of this paragraph characterizes example 10 of the present disclosure, wherein example 10 also includes the subject matter according to any one of examples 1-9, above.

The odd number of laser diodes are equally spaced around the orifice. The preceding subject matter of this paragraph characterizes example 11 of the present disclosure, wherein example 11 also includes the subject matter according to any one of examples 1-10, above.

The reflective chamber comprises a conical cavity, a cylindrical cavity, and a cup-shaped cavity, and wherein the conical cavity is between the orifice and the cylindrical cavity, and wherein the cylindrical cavity is between the cup-shaped cavity and the conical cavity. The preceding subject matter of this paragraph characterizes example 12 of the present disclosure, wherein example 12 also includes the subject matter according to any one of examples 1-11, above.

The apparatus further includes an even number of laser diodes. The preceding subject matter of this paragraph characterizes example 13 of the present disclosure, wherein example 13 also includes the subject matter according to any one of examples 1-9 and 12, above.

The even number of laser diodes are unequally spaced around the orifice. The preceding subject matter of this paragraph characterizes example 14 of the present disclosure, wherein example 14 also includes the subject matter according to any one of examples 1-9 and 12-13, above.

The plurality of laser diodes arranged annularly around the orifice are aligned with the converging surface. The preceding subject matter of this paragraph characterizes example 15 of the present disclosure, wherein example 15 also includes the subject matter according to any one of examples 1-14, above.

The converging surface is a parabolic surface configured to converge the laser beams at the phosphor converter. The recirculating surface is a spherical surface configured to reflect back recirculating light from the phosphor converter. The preceding subject matter of this paragraph characterizes example 16 of the present disclosure, wherein example 16 also includes the subject matter according to any one of examples 1-15, above.

A method includes projecting laser beams from a plurality of laser diodes onto a converging surface of a reflective chamber of an emitter module, reflecting the laser beams to converge on a phosphor converter at an orifice of the reflective chamber, and recirculating reflected light from the phosphor converter back to the phosphor converter. The preceding subject matter of this paragraph characterizes example 17 of the present disclosure.

The converging surface annularly surrounds a central recirculating surface. The preceding subject matter of this paragraph characterizes example 18 of the present disclosure, wherein example 18 also includes the subject matter according to example 17, above.

The central recirculating surface is a spherical surface. The preceding subject matter of this paragraph characterizes example 19 of the present disclosure, wherein example 19 also includes the subject matter according to any one of examples 17-18, above.

Projecting laser beams from a plurality of laser diodes onto a converging surface comprises projecting collimated light onto the converging surface. The preceding subject matter of this paragraph characterizes example 20 of the present disclosure, wherein example 20 also includes the subject matter according to any one of examples 17-19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

The following description supplies specific details in order to provide a thorough understanding. Nevertheless, the skilled artisan would understand that the apparatus and associated methods of using the apparatus can be implemented and used without employing these specific details. Indeed, the apparatus and associated methods can be placed into practice by modifying the illustrated apparatus and associated methods and can be used in conjunction with any other apparatus and techniques conventionally used in the industry.

As demands for beam control become more stringent, the need for higher illuminance is required. Increases in luminous density allows for luminaries to be smaller and more efficient. Laser diode-pumped emitters, or (LDPEs), are a new and evolving technology. Elements conventionally needed to make LDPEs reliable and efficient, combined with the higher cost of the laser diodes themselves, makes the overall system complex and expensive. Some conventional LDPEs utilize an arrangement of mirrors and optical fibers to transmit the laser light to the phosphor converter, increasing cost and system size. Others conventional LDPEs consist of one or more laser diodes pointed directly at a phosphor converter where the divergent beam creates undesirable emission profiles. Others conventional LDPEs contain no effective method of recycling light emitted back into the LDPE. Embodiments described herein effectively combine multiple elements into a holistic assembly which keeps the laser diodes and light-converting phosphor cool.

Figure 1:
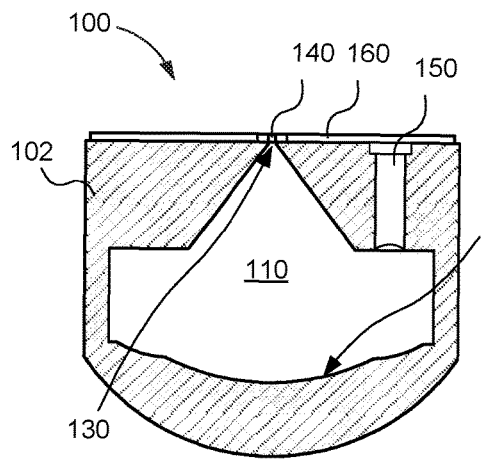
FIG. 1 is a cross-sectional side view of an emitter module, according to one or more embodiments of the present disclosure.
Figure 3:
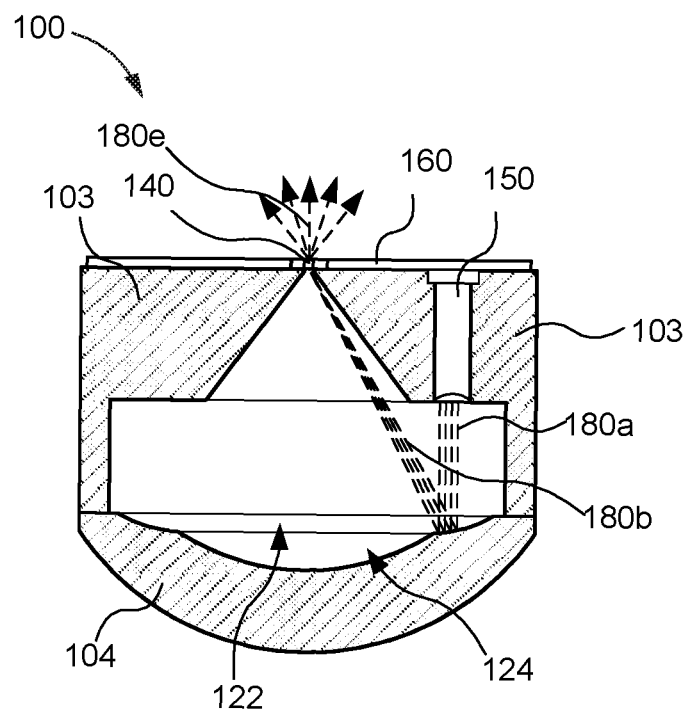
FIG. 3 is a cross-sectional side view of an emitter module, according to one or more embodiments of the present disclosure.
Figure 4:
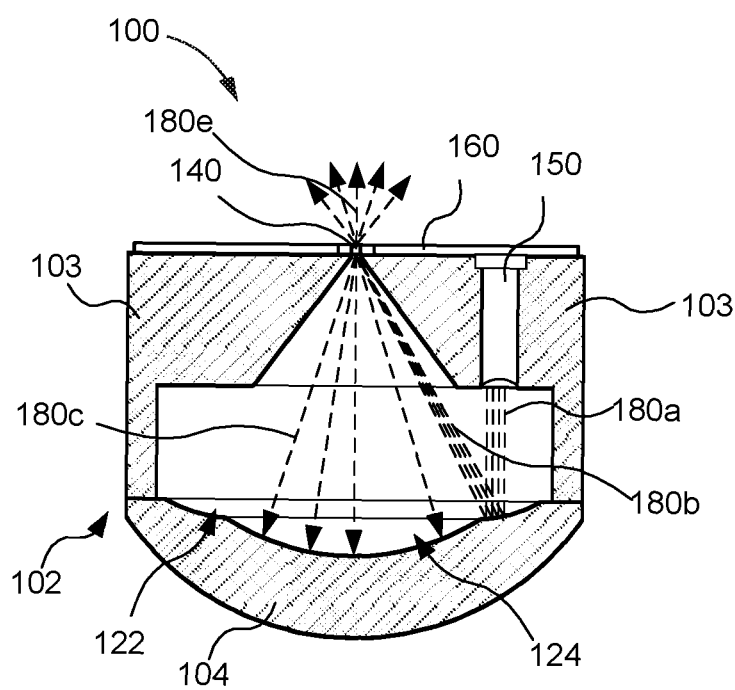
FIG. 4 is a cross-sectional side view of an emitter module, according to one or more embodiments of the present disclosure.
Figure 5:
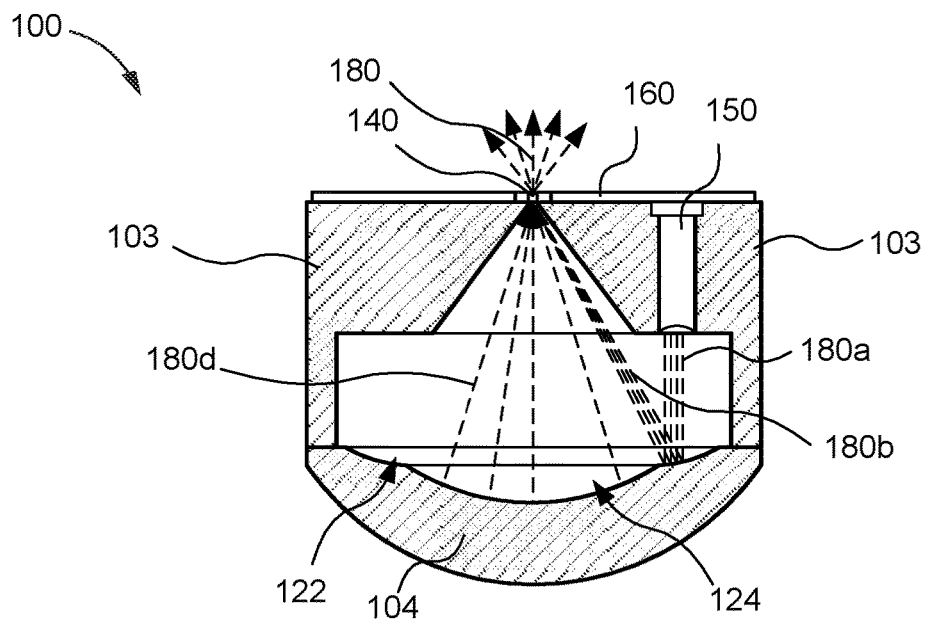
FIG. 5 is a cross-sectional side view of an emitter module, according to one or more embodiments of the present disclosure.

Referring to FIG. 1, an emitter module 100 is depicted in a cross-sectional side view. The emitter module 100 emits light through a phosphor converter 140 positioned at an orifice 130 of an internal reflective chamber 110. The emitter module 100 utilizes a plurality of laser diodes 150 which emit laser beams in a direction opposite from the light emitted through the phosphor converter. (A single laser diode 150 is visible in FIG. 1; see also FIGS. 3-5 showing direction of light emitted from laser diodes.) The emitter module 100 utilizes the reflective chamber 110 to reflect and direct the laser beam towards phosphor converter 140. The emitter module 100 is further configured to reflect and recycle any light returning into the reflective chamber 110 from the phosphor converter 140 and redirect the returning light back to the phosphor converter 140. The emitter module 100 is configured to repeatedly reflect back returning light into the phosphor converter 140 allowing for all or mostly all light to be transmitted out the phosphor converter 140. Although the emitter module 100 is shown and described with certain components and functionality, other embodiments of the emitter module 100 may include fewer or more components to implement less or more functionality.

The emitter module 100 includes a housing 102. In some embodiments, the housing 102 is thermally conductive. Components of the emitter module 100 produce heat which if not controlled or dissipated can lead to performance issues. The housing 102 may include features that aid in the dissipation of heat. In some embodiments, the housing 102 may be formed by coupling a plurality of parts. For example, in the embodiment depicted in FIG. 6 includes a housing 102 formed of two parts, a heat sink 103 and a reflector 104. In yet other embodiments, the housing 102 may be formed by coupling more than two components.

The housing 102 forms an internal reflective chamber 110. The reflective chamber 110 is an enclosed cavity with an orifice 130. The reflective chamber 110 includes a reflective surface 120 on a first side of the reflective chamber 110. In some embodiments, the reflective chamber 110 includes an orifice 130 on a second side of the reflective chamber 110. In some embodiments, the first side is opposite the second side. As depicted in FIG. 1, the reflective chamber 110 includes the reflective surface 120 at a bottom of the reflective chamber 110. The reflective surface 120 is configured to reflect and redirect light towards the orifice 130.

The housing 102 may be made of a reflective material. In some embodiments, the housing 102 is a thermally conductive material that includes a reflective coating. In some embodiments, the reflective coating is applied to the surfaces of the reflective chamber 110.

In some embodiments, the reflective surface 120 includes a first portion and a second portion. In some embodiments, the reflective surface 120 includes a converging surface 122 that annularly surrounds a recirculating surface 124. The converging surface 122 is configured to reflect and converge light towards the orifice 130. The converging surface 122 is adjacent to the recirculating surface 124 and encircles the recirculating surface 124.

The emitter module 100 further includes at least one laser diode 150. In some embodiments, the emitter module 100 includes a plurality of laser diodes 150. The laser diodes 150 are configured to emit laser beams into the reflective chamber 110. In some embodiments, the laser diodes 150 are configured emit light towards the converging surface 122. The laser diodes 150 are powered and emit diverging light into the reflective chamber 110 where the beam is first incident on a reflective surface (e.g., the converging surface, which may be a parabolic surface) and is reflected into a converging beam which is directed and incident to the centrally-located phosphor converter 140. In some embodiments, the laser diodes 150 are configured to emit blue or violet light. Other embodiments may be configured to emit different light on the spectrum.

The emitter module 100 further includes a printed circuit board 160 or other electronic circuitry configured to control and activate the emitter module 100 and/or the laser diodes 150. In the illustrated embodiment, the printed circuit board 160 is coupled to the top of the housing 102. When the emitter module 100 is coupled to a fixture, the circuitry of the fixture and the printed circuit board 160 work cooperatively to operate and control the emitter module 100.

The emitter module 100 further includes a phosphor converter 140 at the orifice 130. In some embodiments, the phosphor converter 140 is a monocrystalline structure. In some embodiments, the phosphor converter 140 is a polycrystalline structure. In some embodiments, the phosphor converter 140 is a monocrystalline or polycrystalline structure containing a proportionately-small amount of Cerium suspended in a Yttrium Aluminum Garnet matrix (YAG:Ce). In some embodiments, the Cerium is the absorbing element that causes the incident blue or violet light to be absorbed and Stokes-shifted into a lower energy colors such as yellow, green, and red. In another embodiment, the phosphor converter 140 is a sintered ceramic containing (YAG:Ce), red nitrides, and alumina, in such concentrations to cause a wider spectrum of light to emitted from the phosphor convertor 140. Other embodiments of the phosphor converter 140 are contemplated herein.

Figure 2A:
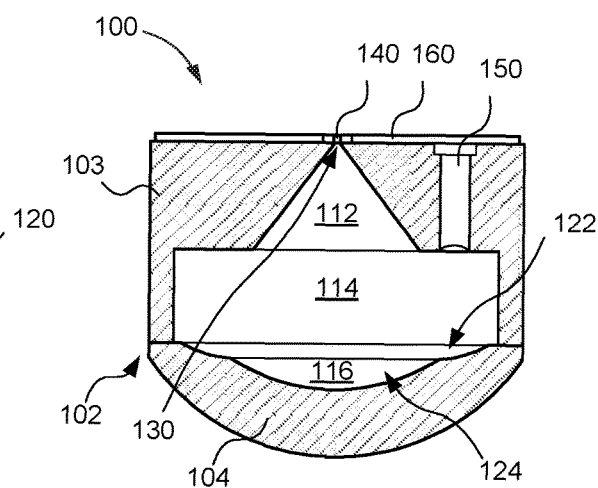
FIG. 2A-2C are cross-sectional side and elevated views of an emitter module, according to one or more embodiments of the present disclosure.
Figure 2B:
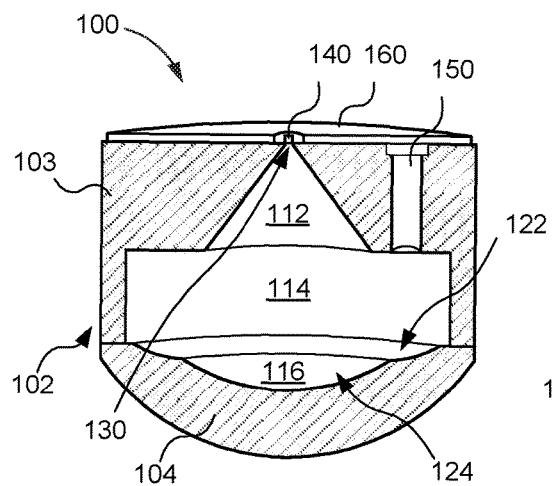
Figure 2C:
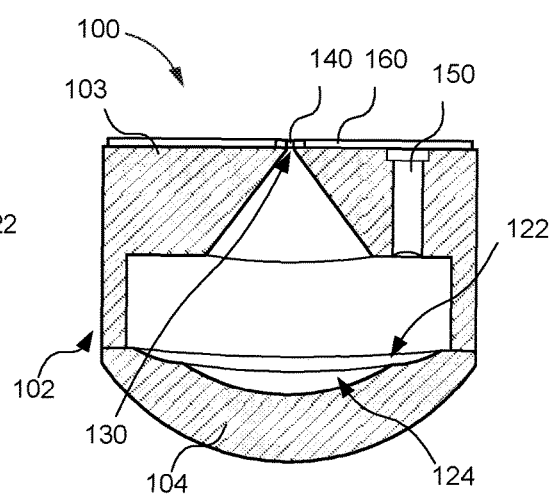

Referring to FIGS. 2A-2C, an embodiment of an emitter module 100 is shown. In FIG. 2A, a cross-sectional side view is shown. In FIG. 2B, an upper elevated side view is shown. In FIG. 2C, a lower elevated side view is shown. The emitter module 100 of FIGS. 2A-2C may include all the features of the previous embodiments. In the illustrated embodiment, the housing 102 is formed by a heat sink 103 and a reflector 104. The heat sink 103 includes a conical cavity 112 below the orifice 130. The heat sink 103 further includes a cylindrical cavity 114 below the conical cavity 112. The reflector 104 forms cup-shaped cavity 116. The conical cavity 114, the cylindrical cavity 114 and the cup-shaped cavity 116 together encompass the reflective chamber 110.

Referring to FIGS. 3-5, embodiments of an emitter module 100 are shown. Referring to FIG. 3, the laser diode 150 is powered, in part, by the printed circuit board 160. In some embodiments, the laser diode 150 emits a collimated light 180*a*. In some embodiments, the laser diode 150 emits divergent light. The laser diode 150 is positioned and configured to emit light on the converging surface 122 on an opposite side of the reflective chamber 110. In some embodiments, the laser diodes 150 are configured to emit light in a direction opposite the light emitted out of the emitter module 100 at the phosphor converter 140. The converging surface 122 may be a parabolic surface. The parabolic surface converges the collimated light 180*a* to redirect the reflected light 180*b* towards the phosphor converter 140. In other embodiments, the converging surface 122 is not a parabolic surface but is free formed. The converging surface 122 is shaped to help converge light emitted by the laser diodes 150 to the phosphor converter 140.

FIG. 3 depicts the first reflection on the converging surface 122. Upon interaction with the phosphor converter 140, a portion of the incident and converted light transmits out of the emitter module 100 as emitted light 180*e*. Not all of the reflected light 180*b* is converted and emitted out the phosphor converter 140 as emitted light 180*e*. A portion of the reflected light 180*b* is re-emitted or reflected back into the emitter module 100 as re-emitted light 180*c*, (see FIG. 4). The re-emitted light 180*c* may include both reflected light and converted light from the phosphor converter 140. Upon re-entry into the emitter module the re-emitted light 180*c* from the phosphor converter 140 becomes incident to the recirculating surface 124 and a portion to the converging surface 122. The recirculating surface 124, in some embodiments, is a spherical shaped surface configured to recirculate the re-emitted light 180*c* back to the phosphor converter 140 as recirculated light 180*d* (see FIG. 5). In other embodiments, the recirculating surface 124 includes a free form shape configured to redirect light to the phosphor convertor 140.

In the event light is incident to the recirculating surface, the recirculated light 180*d* is reflected to the phosphor converter 140. The emitter module 100 is configured to repeat the same absorption-reflection-transmission cycle described herein until all or mostly all light is emitted out through the phosphor converter 140.

In the event light is incident to the parabolic reflector or non-ideal angles to other surfaces in the reflective chamber 110 such as the surface of the conical cavity 112 or the surface of the cylindrical cavity 114, the light continues to reflect off the surfaces of the reflective chamber 110 until mostly all of the light escapes through the phosphor converter 140.

Figure 6:
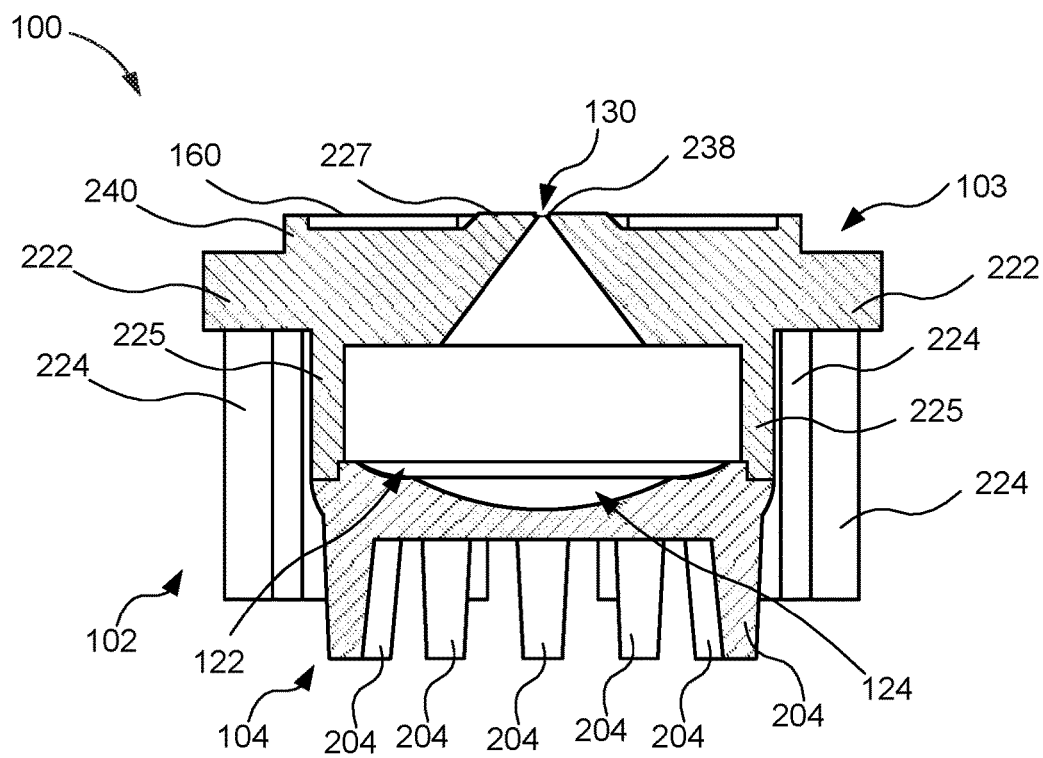
FIG. 6 is a cross-sectional side view of an emitter module, according to one or more embodiments of the present disclosure.

Referring now to FIG. 6, a cross-sectional side view of another embodiment of an emitter module 100 is shown. The emitter module 100 includes a heat sink 103 and a reflector 104 coupled to the heat sink 103 to form an internal cavity. The emitter module 100 is depicted without the phosphor converter 140 to show the orifice 130. The emitter module 100 includes the heat sink 103, the reflector 104, and the printed circuit board 160. Although the emitter module 100 is shown and described with certain components and functionality, other embodiments of the emitter module 100 may include fewer or more components to implement less or more functionality.

The emitter module 100 is a modular assembled unit. The illustrated embodiment includes a heat sink 103. The heat sink 103 is a monolithic solid material capable of transferring heat from the printed circuit board 160 and the phosphor converter 140, and the laser diodes 150 to the surrounding atmosphere. The heat sink 103 includes a circular primary disc 222. On a front side of the primary disc 222, the heat sink 103 includes a protruding rim 240. The protruding rim 240 is a circular raised annular surface that includes an outer rim surface, a front rim surface, and an inner rim surface. The protruding rim 240 forms a cavity into which the printed circuit board 160 is bonded to the heat sink 103.

Figure 7:
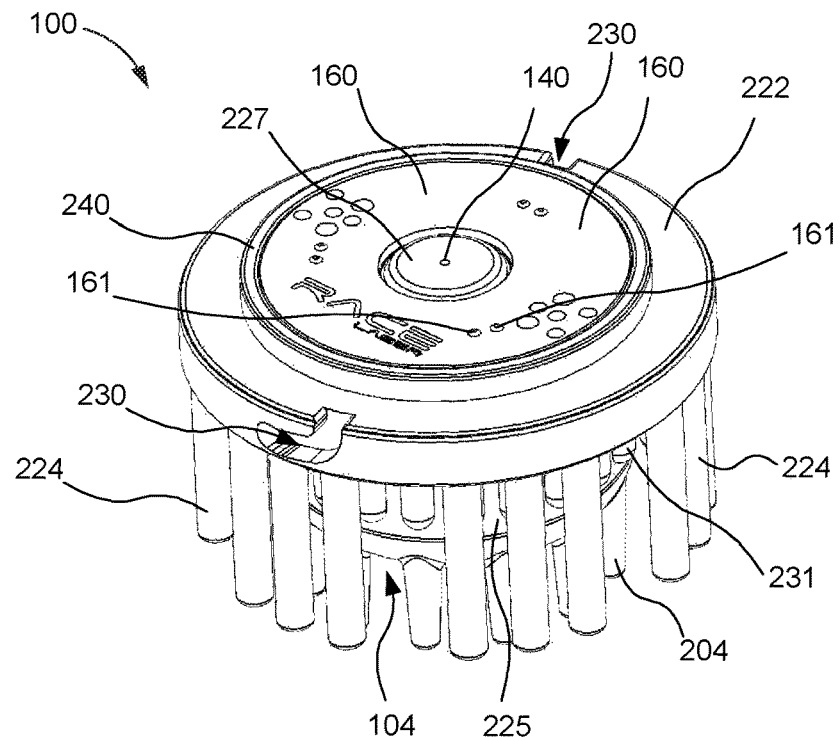
FIG. 7 is a perspective view of an emitter module, according to one or more embodiments of the present disclosure.
Figure 8:
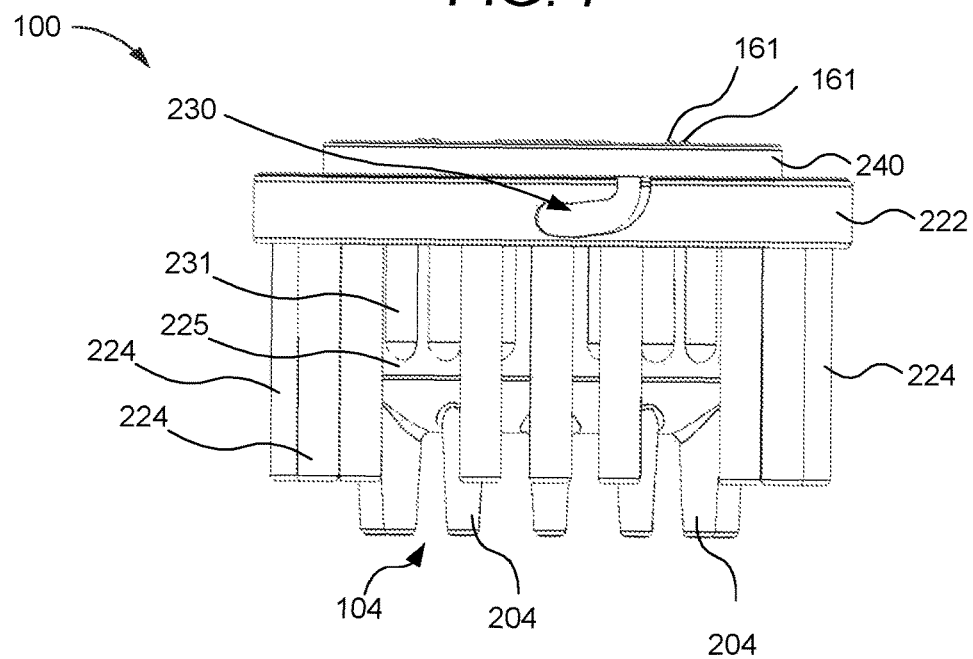
FIG. 8 is a side view of an emitter module, according to one or more embodiments of the present disclosure.
Figure 9:
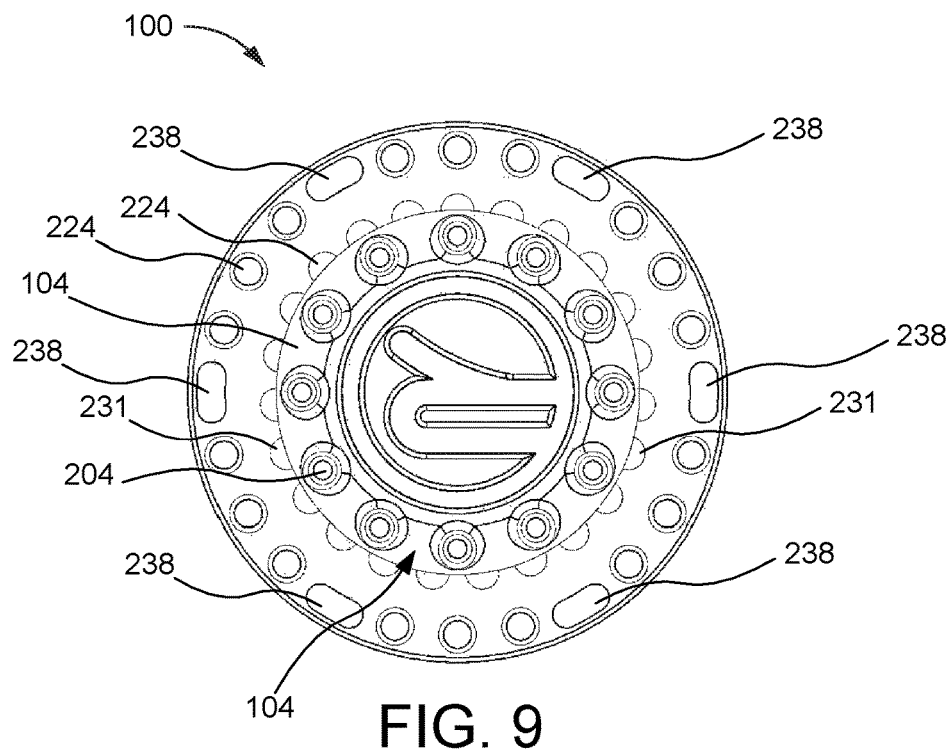
FIG. 9 is a bottom view of an emitter module, according to one or more embodiments of the present disclosure.
Figure 10:
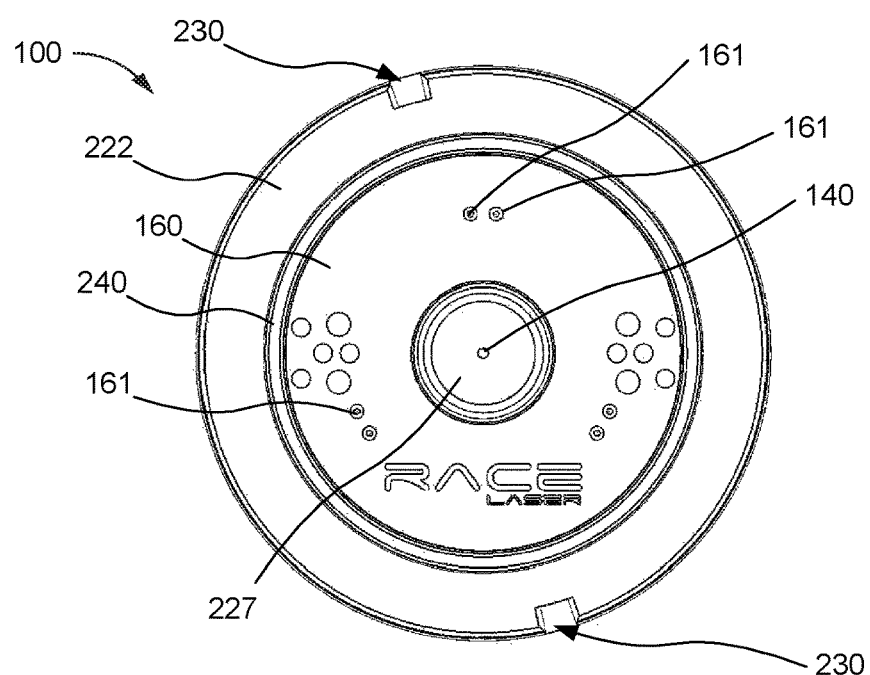
FIG. 10 is a top view of an emitter module, according to one or more embodiments of the present disclosure.

The heat sink 103 further includes a plurality of projections 224 extending out a rear side of the primary disc 222 (see, for example, FIGS. 7-9). The projections 224 are cylindrical projections extending out from the primary disc 222. While the projections 224 are cylindrical in shape, other shapes are comprehended and are not depicted for the sake of brevity. The projections 224 increase the surface area of the heat sink 103 which improves the heat transfer capabilities of the heat sink 103. On the outer race surface of the primary disc 222, the heat sink 103 includes two bayonet slots 230 which are configured to interface with a fixture to hold the emitter module 100 (see FIGS. 7-8 and 10). Although depicted with two bayonet slots 230, the heat sink 103 may include more or less slots in other embodiments. In addition, although depicted as bayonet slots 230, other mating interfaces are contemplated within this disclosure.

The bayonet slot 230 is an L-shaped or J-shaped curved slot that allows the emitter module 100 to be inserted into a receptacle and twisted slightly to secure the emitter module 100 to a fixture. In some embodiments, the heat sink 103 further includes indentations 238 (see FIG. 9) on the rear side of the primary disc 222. The illustrated embodiment depicts six indentations 238 on the rear side of the primary disc 222. The indentations 238 may interface with a socket tool with oblong projections.

Referring again to FIG. 6, the heat sink 103 includes a raised plateau 227 centered within the protruding rim 240. The raised plateau 227 includes a step ledge 238 centered within the raised plateau 227. The step ledge 238 is configured to receive the phosphor converter 140. As such the step ledge 238 is shaped to compliment the shape of the phosphor converter 140. In the illustrated embodiments herein, the phosphor converter 140 is a circular disc shape. In other embodiments, the phosphor converter 140 may be other shapes including, but not limited to, rectangular, square, or another shape. In addition, while a single phosphor converter 140 is depicted, other embodiments may include a plurality of phosphor converters 140 and a plurality of step ledges 238 and orifices 130.

The heat sink 103 further includes an annular ring 225 that forms a cylindrical cavity 114. Referring to FIGS. 7-9 and 15-16, the annular ring 225 includes a plurality of ridge protrusions 231 that extend out an outer surface of the annular ring 225. The inner surface of the annular ring 225 is a reflective surface that forms part of the reflective chamber 110.

Referring to FIG. 7, a perspective view of the emitter module 100 is shown. The printed circuit board 160 includes connector pads 161 that interface with the connectors of the laser diodes 150 (see, for example, FIG. 11-14). The printed circuit board 160 further includes other connections that are configured to interface with fixtures to operate the emitter modules 100.

The printed circuit board 160, in some embodiments, may be directly bonded to the heat sink 103. In some embodiments, there are no air gaps between the printed circuit board 160 and the heat sink 103. In some embodiments, the printed circuit board 160 is soldered to the heat sink 103. In some embodiments, the printed circuit board 160 is adhered to the heat sink 103 by an adhesion medium. The printed circuit board 160 is in thermal communication with the heat sink 103. Some embodiments may include thermal grease or a thermal pad between the printed circuit board 160 and the heat sink 103 to enhance heat transfer.

Figure 11:
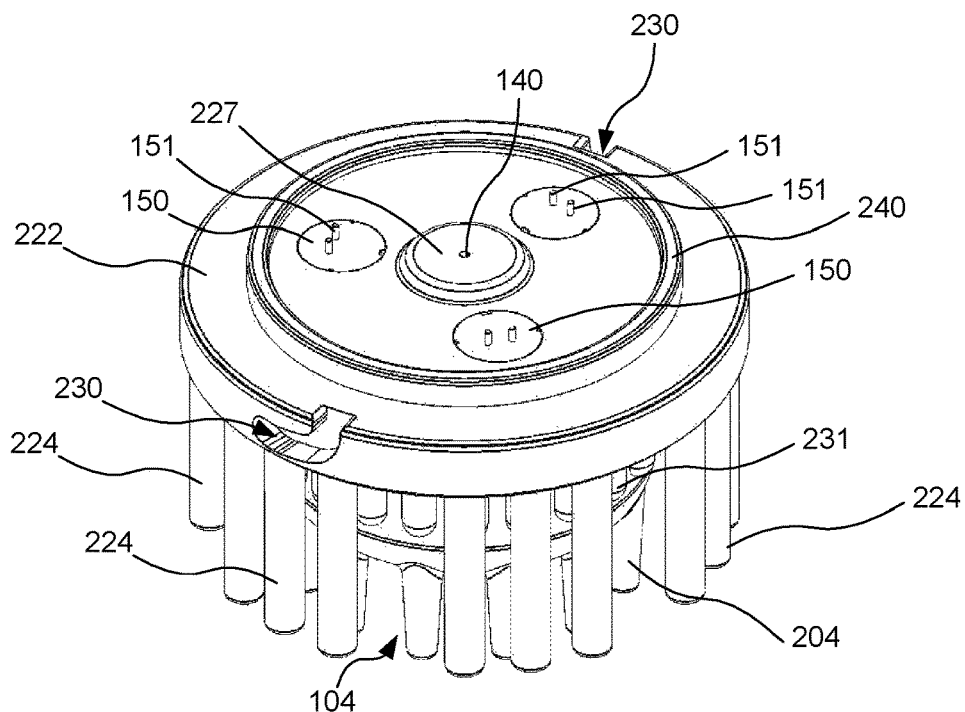
FIG. 11 is a perspective view of an emitter module without a printed circuit board, according to one or more embodiments of the present disclosure.

In some embodiments, the printed circuit board 160 is not adhered to the heat sink 103 to allow access to the laser diodes 150. Referring to FIG. 11, the emitter module 100 is shown with the printed circuit board 160 removed. As shown the emitter module 100 includes three laser diodes 150 which are positioned to annularly surround the orifice 130. In some embodiments, the plurality of laser diodes 150 arranged annularly around the orifice 130 are aligned with the converging surface 122 of the reflector 104. For example, the laser diodes 150 are configured to emit light towards the converging surface 122.

Referring to FIGS. 15-19, the heat sink 103 is depicted in various views. In some embodiments, the heat sink 103 includes a conical cavity below the orifice 130. In some embodiments, the heat sink 103 includes a plurality of apertures 250 arranged annularly around the central orifice 130 to receive the plurality of laser diodes 150. In some embodiments, the heat sink 103 includes a protruding rim 140 on a first side of the heat sink 103, the protruding rim 140 annularly surrounding the plurality of apertures 150. In some embodiments, the heat sink 103 includes a plurality of projections 224 extending out a second side of the heat sink 103.

Referring to FIGS. 6-9, the emitter module 100 further includes a reflector 104. The reflector 104 of FIGS. 6-9 is similar to the reflector 104 shown and described in FIGS. 3-5. The reflector 104 is coupled to the heat sink 103 to form the housing. The reflector 104 includes converging surface 122 and a recirculating surface 124. Referring also to FIGS. 20-23, the reflector 104 is shown in various views. The converging surface 122 annularly surrounds the recirculating surface 124. In some embodiments, the converging surface 122 encircles the recirculating surface 124. In some embodiments, the reflector 104 further includes reflector protrusions 204 which extend out an opposite side of the reflector 104 from the converging surface 122 and the recirculating surface 124. The reflector protrusions 204 are configured to dissipate heat similar to the protrusions 224 of the heat sink 103. In some embodiments, the reflector 104 does not include any reflector protrusions 204 (see, for example, FIGS. 12 and 13).

Figure 12:
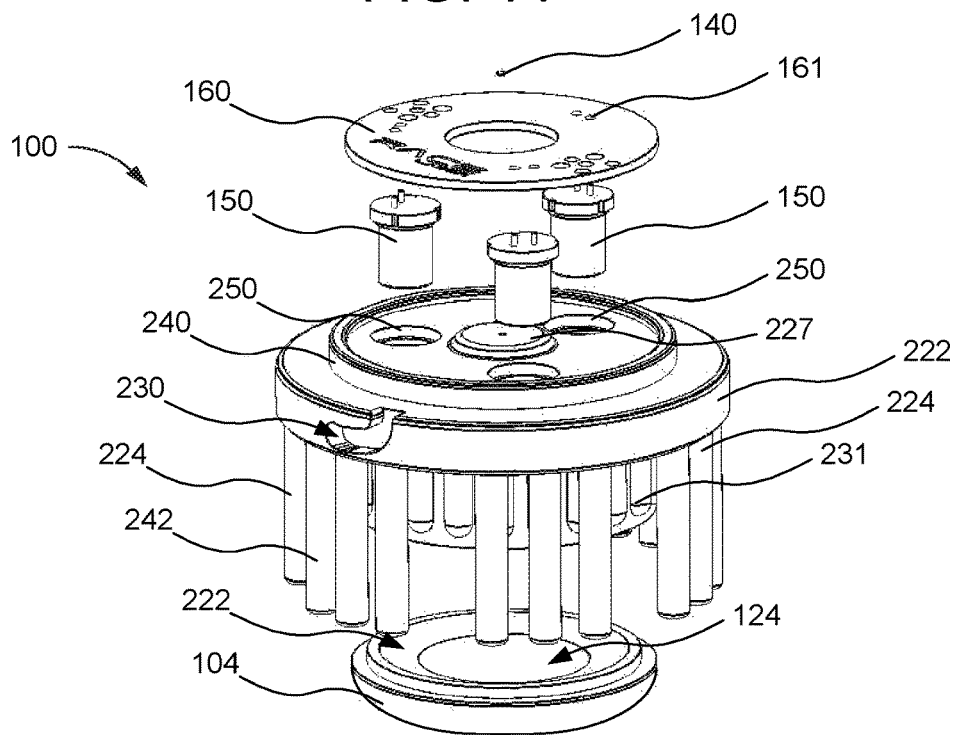
FIG. 12 is an exploded perspective view of an emitter module, according to one or more embodiments of the present disclosure.
Figure 13:
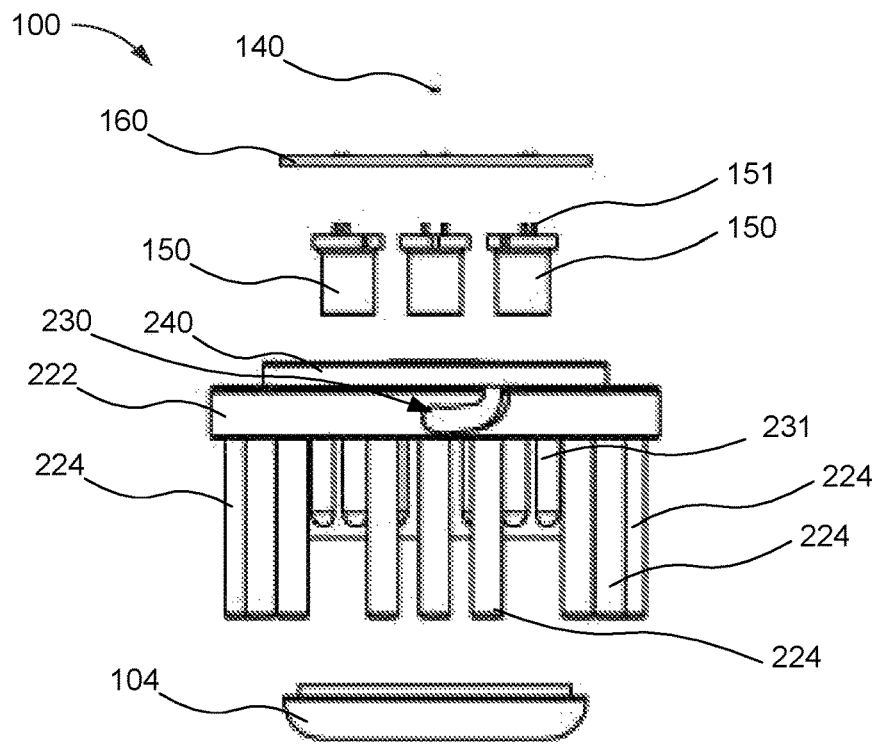
FIG. 13 is an exploded side view of an emitter module, according to one or more embodiments of the present disclosure.
Figure 14:
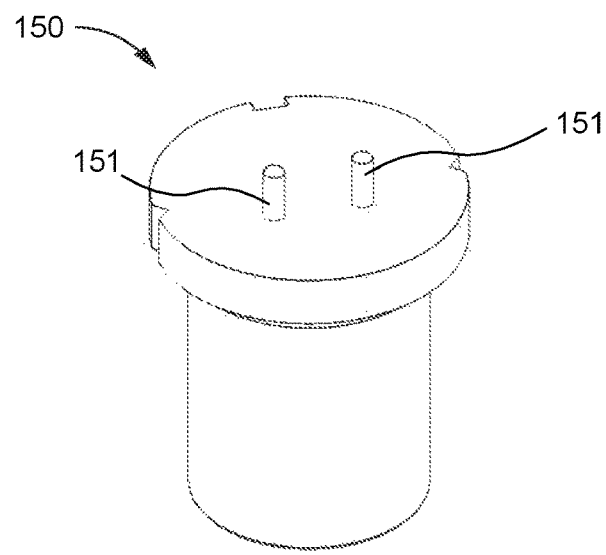
FIG. 14 is a perspective view of laser diode, according to one or more embodiments of the present disclosure.
Figure 15:
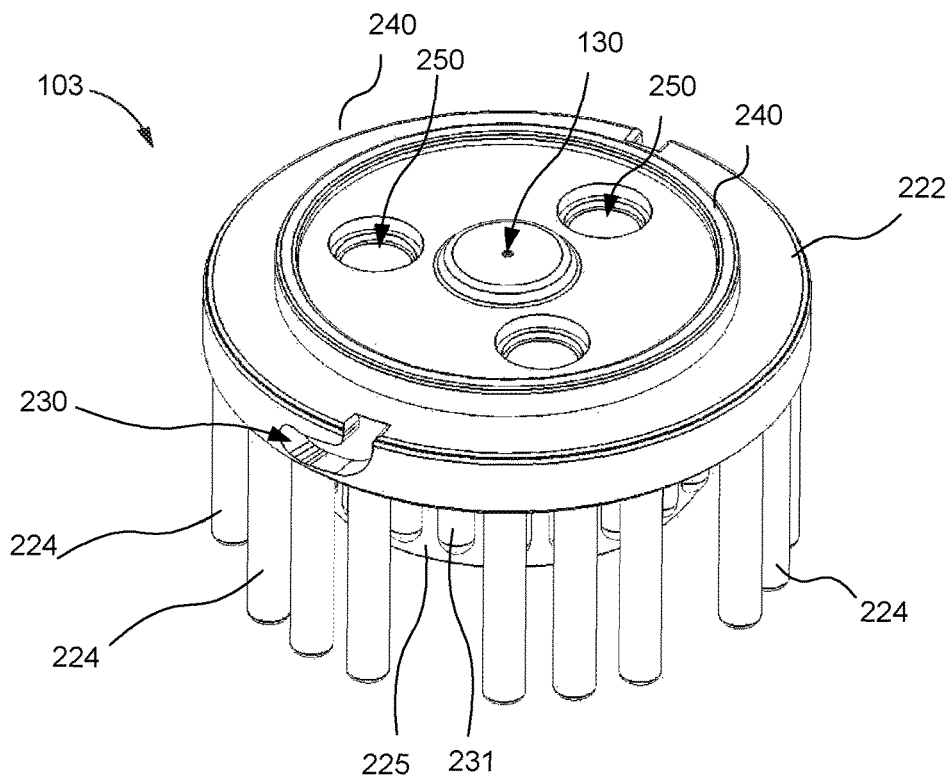
FIG. 15 is a perspective view of a heat sink, according to one or more embodiments of the present disclosure.
Figure 16:
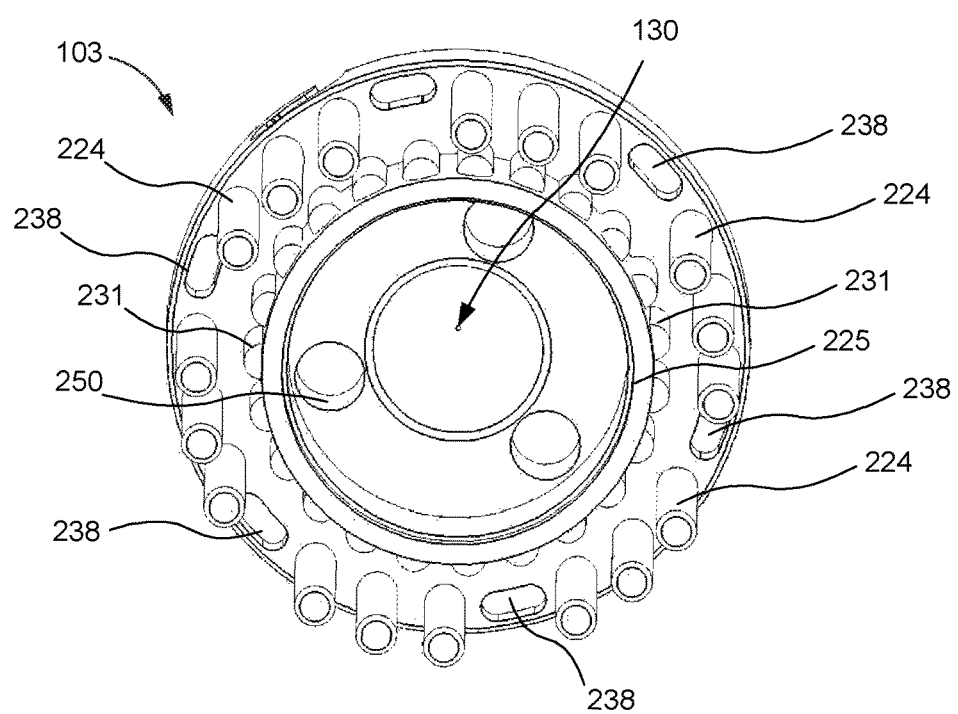
FIG. 16 is another perspective view of a heat sink, according to one or more embodiments of the present disclosure.
Figure 17:
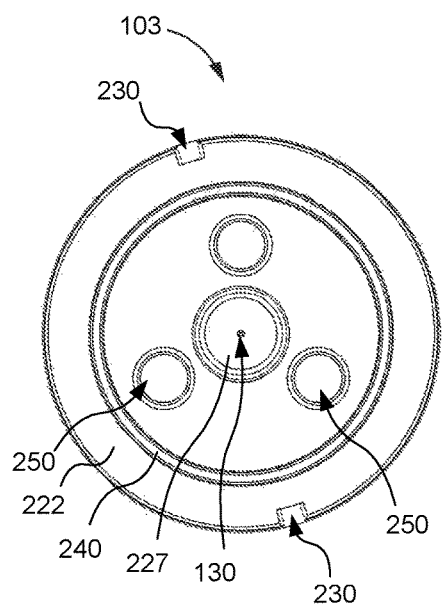
FIG. 17 is a top view of a heat sink, according to one or more embodiments of the present disclosure.
Figure 18:
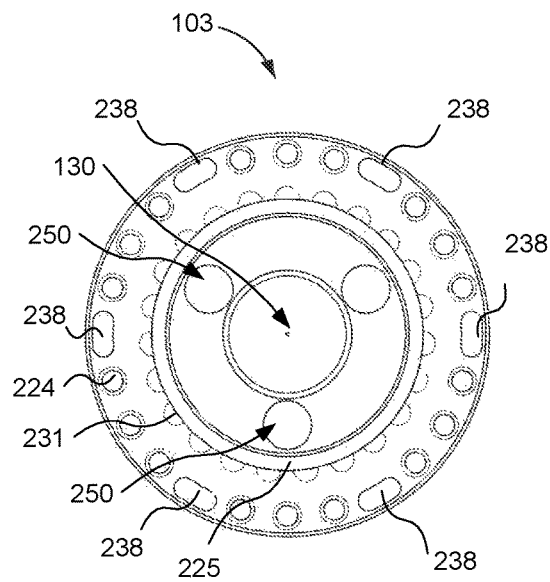
FIG. 18 is a bottom view of a heat sink, according to one or more embodiments of the present disclosure.
Figure 19:
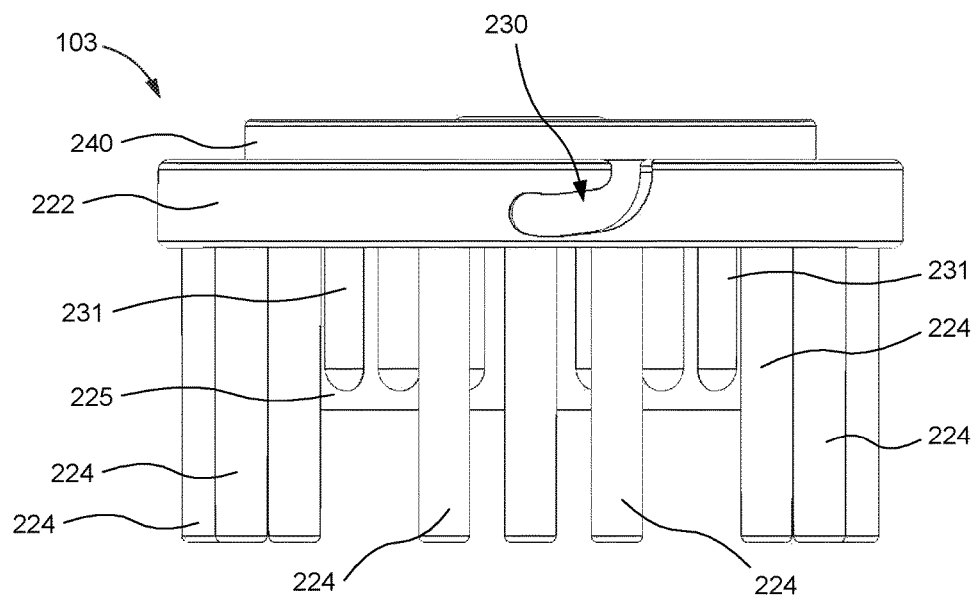
FIG. 19 is a side view of a heat sink, according to one or more embodiments of the present disclosure.
Figure 20:
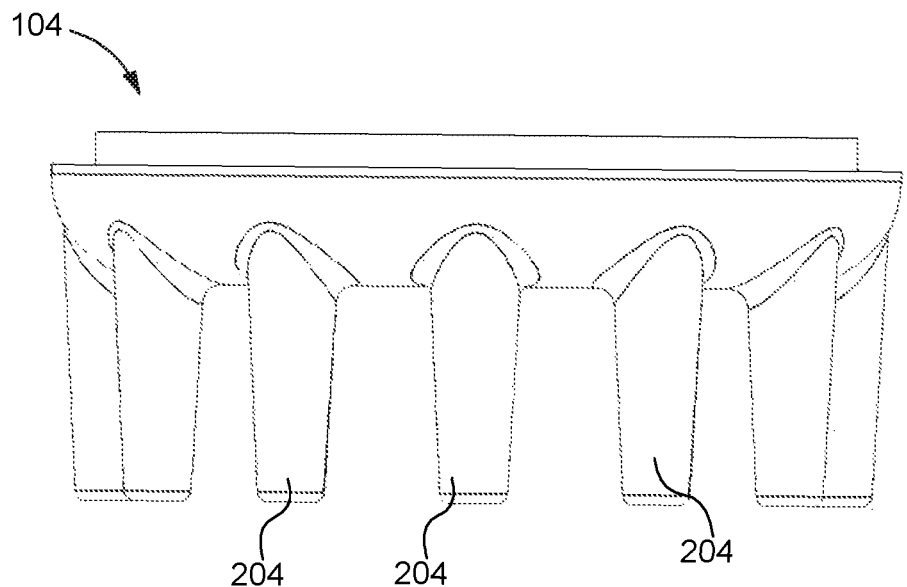
FIG. 20 is a side view of a reflector, according to one or more embodiments of the present disclosure.
Figure 21:
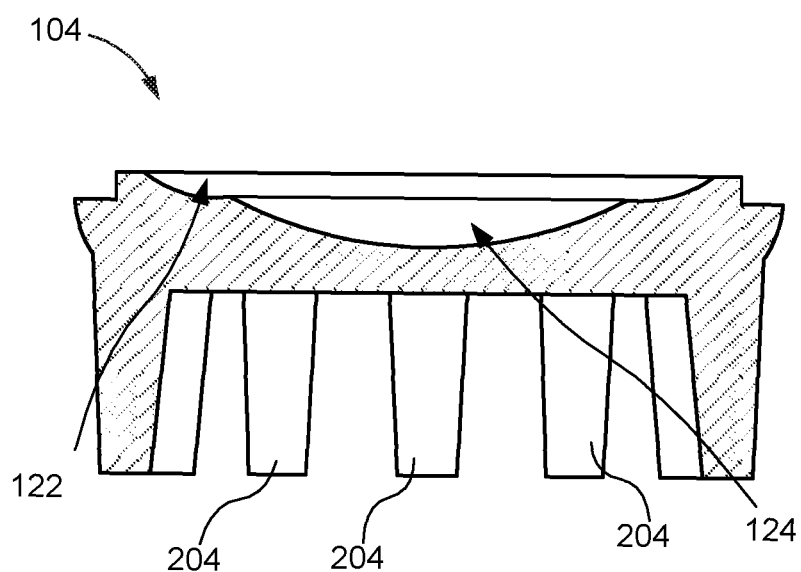
FIG. 21 is a cross-sectional side view of a reflector, according to one or more embodiments of the present disclosure.
Figure 22:
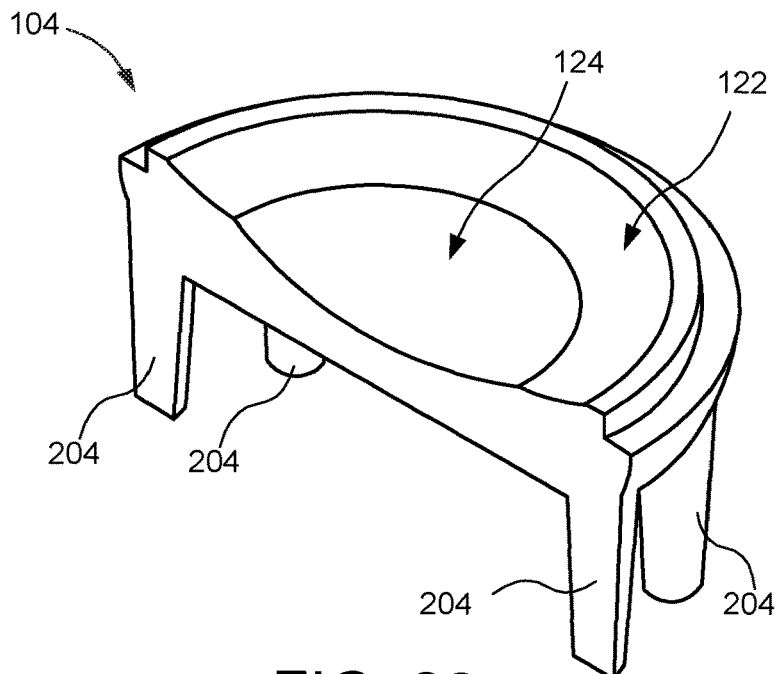
FIG. 22 is a cross-sectional perspective view of a reflector, according to one or more embodiments of the present disclosure.
Figure 23:
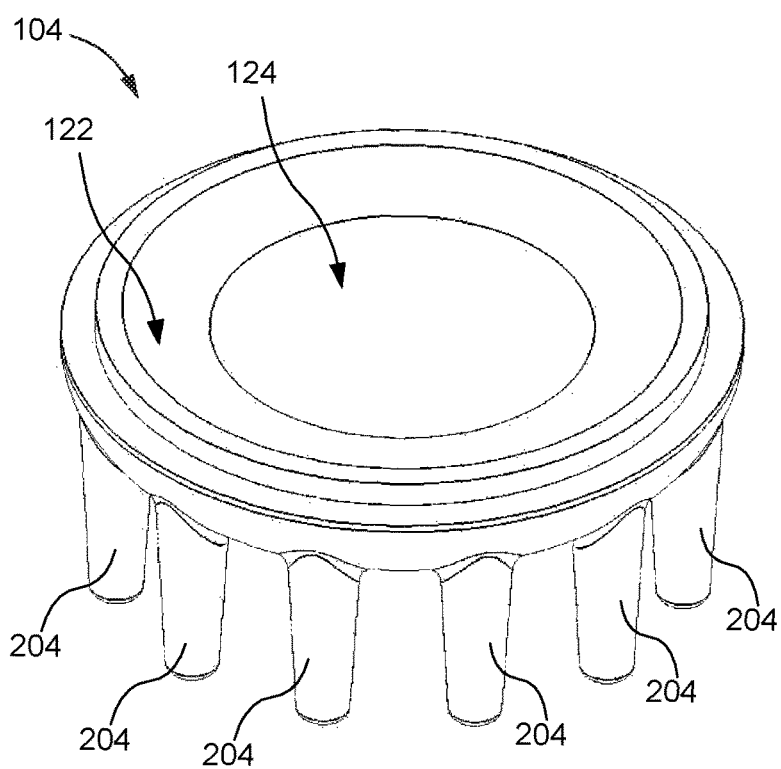
FIG. 23 is a perspective view of a reflector, according to one or more embodiments of the present disclosure.

Referring to FIG. 12, the heat sink 103 includes three apertures 250 arranged annularly around the central orifice 130 to receive the plurality of laser diodes 150. In the illustrated embodiment, the apertures 250 are spaced equally around the orifice 130. In some embodiments, the heat sink 103 includes an even number of apertures 250 and even number laser diodes 150. In some embodiments, the even number of laser diodes 150 are arranged in unequal spacing around the orifice 130. In some embodiments, the laser diodes 150 are arranged so that light reflected by the phosphor converter 140 does not become incident to other laser diodes 150 before a significant amount of the incident energy concentration is dissipated.

Figure 24:
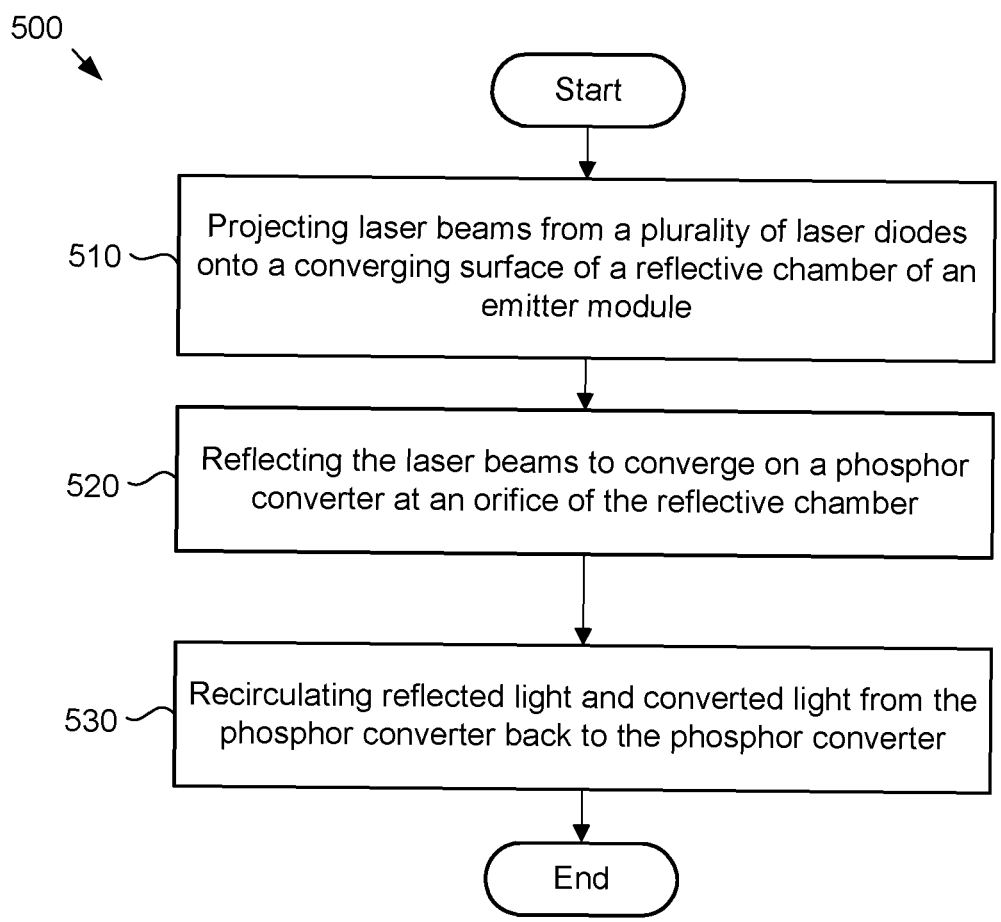
FIG. 24 is a schematic diagram of a method, according to one or more embodiments of the present disclosure.

Now referring to FIG. 24, one embodiment of a method 500 is shown. The method 500 includes projecting laser beams from a plurality of laser diodes onto a converging surface of a reflective chamber of an emitter module at 510. At 520, the method 500 includes reflecting the laser beams to converge on a phosphor converter at an orifice of the reflective chamber. At 530, the method 500 includes recirculating reflected light and recirculated light from the phosphor converter back to the phosphor converter. The method then ends.

In some embodiments, the converging surface annularly surrounds a central recirculating surface. In some embodiments, the central recirculating surface is a spherical surface. In some embodiments, projecting laser beams from a plurality of laser diodes onto a converging surface comprises projecting collimated light onto the converging surface.

Although described in a depicted order, the method may proceed in any of a number of ordered combinations.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. An apparatus comprising:
   a thermally conductive housing comprising a reflective chamber, the reflective chamber comprising a reflective surface on a first side of the reflective chamber and an orifice on a second side of the reflective chamber, wherein the reflective surface comprises a converging surface annularly surrounding a central recirculating surface, wherein the reflective chamber is formed by a heat sink and a reflector coupled to the heat sink, wherein the reflector comprises the reflective surface and the heat sink comprises the orifice;
   a phosphor converter at the orifice of the reflective chamber;
   a plurality of laser diodes arranged annularly around the orifice, the plurality of laser diodes configured to emit laser beams towards the converging surface.

2. The apparatus of claim 1, wherein the converging surface is a parabolic surface configured to converge the laser beams at the phosphor converter.

3. The apparatus of claim 1, wherein the recirculating surface is a spherical surface configured to reflect back recirculating light from the phosphor converter.

4. The apparatus of claim 1, the heat sink comprising a conical cavity below the orifice.

5. The apparatus of claim 1, the heat sink comprising a plurality of apertures arranged annularly around the central orifice to receive the plurality of laser diodes.

6. The apparatus of claim 1, the heat sink comprising a protruding rim on a first side of the heat sink, the protruding rim annularly surrounding the plurality of apertures.

7. The apparatus of claim 6, the heat sink comprising a plurality of projections extending out a second side of the heat sink.

8. The apparatus of claim 1, the heat sink comprising:
   a conical cavity below the orifice;
   a plurality of apertures arranged annularly around the central orifice to receive the plurality of laser diodes;
   a protruding rim on a first side of the heat sink, the protruding rim annularly surrounding the plurality of apertures; and
   a plurality of projections extending out a second side of the heat sink.

9. The apparatus of claim 1, the apparatus comprising an odd number of laser diodes.

10. The apparatus of claim 9, wherein the odd number of laser diodes are equally spaced around the orifice.

11. The apparatus of claim 1, wherein the reflective chamber comprises a conical cavity, a cylindrical cavity, and a cup-shaped cavity, and wherein the conical cavity is between the orifice and the cylindrical cavity, and wherein the cylindrical cavity is between the cup-shaped cavity and the conical cavity.

12. The apparatus of claim 1, the apparatus comprising an even number of laser diodes.

13. The apparatus of claim 12, wherein the even number of laser diodes are unequally spaced around the orifice.

14. The apparatus of claim 1, wherein the plurality of laser diodes arranged annularly around the orifice are aligned with the converging surface.

15. The apparatus of claim 1, wherein:
   the converging surface is a parabolic surface configured to converge the laser beams at the phosphor converter; and
   the recirculating surface is a spherical surface configured to reflect back recirculating light from the phosphor converter.

16. A method comprising:
   projecting laser beams from a plurality of laser diodes onto a converging surface of a reflective chamber of an emitter module, wherein the reflective chamber is formed by a heat sink and a reflector coupled to the heat sink;
   reflecting the laser beams to converge on a phosphor converter at an orifice of the reflective chamber, wherein the reflector comprises the reflective surface and the heat sink comprises the orifice; and
   recirculating reflected light and recirculated light from the phosphor converter back to the phosphor converter.

17. The method of claim 16, wherein the converging surface annularly surrounds a central recirculating surface.

18. The method of claim 17, wherein the central recirculating surface is a spherical surface.

19. The method of claim 16, wherein projecting laser beams from a plurality of laser diodes onto a converging surface comprises projecting collimated light onto the converging surface.

* * * * *